US011726844B2

(12) United States Patent
Chen et al.

(10) Patent No.: US 11,726,844 B2
(45) Date of Patent: Aug. 15, 2023

(54) DATA SHARING SYSTEM AND DATA SHARING METHOD THEREFOR

(71) Applicant: Shanghai Cambricon Information Technology Co., Ltd, Pudong New Area (CN)

(72) Inventors: Tianshi Chen, Pudong New Area (CN); Shuai Hu, Pudong New Area (CN); Yifan Hao, Pudong New Area (CN); Yufeng Gao, Pudong New Area (CN)

(73) Assignee: SHANGHAI CAMBRICON INFORMATION TECHNOLOGY CO., LTD, Pudong New Area (CN)

( * ) Notice: Subject to any disclaimer, the term of this patent is extended or adjusted under 35 U.S.C. 154(b) by 761 days.

(21) Appl. No.: 16/694,176

(22) Filed: Nov. 25, 2019

(65) Prior Publication Data

US 2020/0118004 A1 Apr. 16, 2020

Related U.S. Application Data

(63) Continuation of application No. 16/693,918, filed on Nov. 25, 2019, now Pat. No. 10,901,815, which is a
(Continued)

(30) Foreign Application Priority Data

Jun. 20, 2018 (CN) .......................... 201810641721.9

(51) Int. Cl.
*G06F 9/54* (2006.01)
*G06N 3/063* (2023.01)
(Continued)

(52) U.S. Cl.
CPC .............. *G06F 9/544* (2013.01); *G06F 9/223* (2013.01); *G06F 12/0875* (2013.01);
(Continued)

(58) Field of Classification Search
CPC ............................. G06N 3/0454; G06N 3/088
See application file for complete search history.

(56) References Cited

U.S. PATENT DOCUMENTS 8,635,412 B1 1/2014 Wilshire
2007/0226718 A1 9/2007 Watanabe
(Continued)

FOREIGN PATENT DOCUMENTS

CN 1200513 A 12/1998
CN 1522402 A 8/2004
(Continued)

OTHER PUBLICATIONS

CN201710515517.8—Office Action dated Jul. 31, 2020, 13 pages. (No English Translation).
(Continued)

*Primary Examiner* — Michael J Metzger
(74) *Attorney, Agent, or Firm* — Getech Law LLC; Jun Ye

(57) ABSTRACT

The present disclosure provides a processing device for performing generative adversarial network and a method for machine creation applying the processing device. The processing device includes a memory configured to receive input data including a random noise and reference data, and store a discriminator neural network parameter and a generator neural network parameter, and the processing device further includes a computation device configured to transmit the random noise input data into a generator neural network and perform operation to obtain a noise generation result, and input both of the noise generation result and the reference data into a discriminator neural network and perform operation to obtain a discrimination result, and further configured to update the discriminator neural network
(Continued)

parameter and the generator neural network parameter according to the discrimination result.

16 Claims, 3 Drawing Sheets

Related U.S. Application Data continuation-in-part of application No. PCT/CN2018/092829, filed on Jun. 26, 2018.

(51) Int. Cl.

| | |
|---|---|
| *G06F 9/22* | (2006.01) |
| *G06F 12/0875* | (2016.01) |
| *G06F 13/28* | (2006.01) |
| *G06N 3/088* | (2023.01) |
| *G06F 30/27* | (2020.01) |
| *G06F 15/163* | (2006.01) |
| *G06N 3/04* | (2023.01) |
| *G06N 3/045* | (2023.01) |
| *H04L 12/70* | (2013.01) |

(52) U.S. Cl.
CPC ............ *G06F 13/28* (2013.01); *G06F 15/163* (2013.01); *G06F 30/27* (2020.01); *G06N 3/04* (2013.01); *G06N 3/045* (2023.01); *G06N 3/063* (2013.01); *G06N 3/088* (2013.01); *G06F 2212/452* (2013.01); *H04L 2012/5686* (2013.01)

(56) References Cited

U.S. PATENT DOCUMENTS

| | | | |
|---|---|---|---|
| 2009/0265500 A1 | 10/2009 | Kyusojin | |
| 2012/0131283 A1 | 5/2012 | Mital et al. | |
| 2016/0103743 A1 | 4/2016 | Sanghi et al. | |
| 2016/0179434 A1 | 6/2016 | Herrero Abellanas et al. | |
| 2016/0217198 A1 | 7/2016 | Lee et al. | |
| 2017/0169812 A1 | 6/2017 | Lample et al. | |
| 2017/0351522 A1* | 12/2017 | Ayub | G06F 9/3834 |
| 2018/0136912 A1* | 5/2018 | Venkataramani | G06N 3/04 |
| 2018/0218261 A1* | 8/2018 | Myara | G06Q 20/00 |
| 2018/0336471 A1* | 11/2018 | Rezagholizadeh | G06N 3/088 |
| 2019/0139191 A1* | 5/2019 | Liu | G06K 9/6259 |
| 2019/0294413 A1* | 9/2019 | Vantrease | G06N 3/063 |

FOREIGN PATENT DOCUMENTS

| | | | |
|---|---|---|---|
| CN | 1588425 A | 3/2005 | |
| CN | 1702858 A | 11/2005 | |
| CN | 101739867 A | 6/2010 | |
| CN | 101980149 A | 2/2011 | |
| CN | 102184157 A | 9/2011 | |
| CN | 102741828 A | 10/2012 | |
| CN | 102831011 A | 12/2012 | |
| CN | 102866912 A | 1/2013 | |
| CN | 102930866 A | 2/2013 | |
| CN | 103019656 A | 4/2013 | |
| CN | 103177733 A | 6/2013 | |
| CN | 103347037 A | 10/2013 | |
| CN | 103530600 A | 1/2014 | |
| CN | 103928023 A | 7/2014 | |
| CN | 104021042 A | 9/2014 | |
| CN | 104268603 A | 1/2015 | |
| CN | 104281540 A | 1/2015 | |
| CN | 104463101 A | 3/2015 | |
| CN | 104464423 A | 3/2015 | |
| CN | 104978971 A | 10/2015 | |
| CN | 105159762 A | 12/2015 | |
| CN | 105512723 A | 4/2016 | |
| CN | 105678253 A | 6/2016 | |
| CN | 105793830 A | 7/2016 | |
| CN | 106056212 A | 10/2016 | |
| CN | 106062786 A | 10/2016 | |
| CN | 106407145 A | 2/2017 | |
| CN | 106502806 A | 3/2017 | |
| CN | 106682702 A | 5/2017 | |
| CN | 106781784 A | 5/2017 | |
| CN | 106897248 A | 6/2017 | |
| CN | 106909971 A | 6/2017 | |
| CN | 107590531 A | 1/2018 | |
| CN | 107832768 A | 3/2018 | |
| CN | 107992329 A | 5/2018 | |
| WO | 2015042904 A1 | 4/2015 | |

OTHER PUBLICATIONS

Li Hong, The application of BP Neural Network in Image Correcting Work Based on Matlab Platform, Journal of Langfang Teachers College (Natural Science Edition), vol. 15 No. 1, Feb. 2015, 4 pages.
CN201710497394.X—Office Action, dated May 8, 2020, 11 pages (No English Translation).
CN201710497394.X—Second Office Action, dated Dec. 18, 2020, 8 pages (No English Translation).
Yu Zijian, et al., "FPGA-Based Accelerator for Convolutional Neural Network", Computer Engineering, 2017, 7 pages.
Shijin Zhang, et al., "Cambricon-X: An Accelerator for Sparse Neural Networks", IEEE, 2016, 12 pages.
Shaoli Liu, et al., "Cambricon: An Instruction Set Architecture for Neural Networks", ACM/IEEE, 2016, 13 pages.
CN201710721049.X, Office Action, dated Apr. 23, 2020, 12 pages. (No English Translation).
CN201710721049.X, Second Office Action, dated Nov. 24, 2020, 8 pages. (No English Translation).
CN201810407185.6, Office Action, dated May 27, 2020, 11 pages. (No English Translation).
Shun-Wen Cheng, "Configurable CMOS H-tree Logic Module", Dept. of Electronic Engineering, Far East University, IEEE, 2009, 4 pages.
PCT/CN2018092829, EP18824582.3, Extended European Search Report, dated Aug. 3, 2020, 9 pages.
PCT/CN2018092829, Search Report, dated Sep. 17, 2018, 10 pages. (No English Translation).
CN201710515517.8—Office Action, dated Feb. 23, 2022, 23 pages, (with English translation).
CN201810467383.1—Office Action, dated Aug. 27, 2021, 21 pages, (with English translation).
CN201810641721.9—Office Action, dadted Oct. 9, 2021, 13 pages, (with English translation).
Goodfellow et al., "Generative Adversarial Nets", Jun. 10, 2014, 9 pages.
EP18824582.3, Response to Extended European Search Report dated Aug. 20, 2020, dated Feb. 18, 2021, 13 pages.
EP18824582.3, Response to the Invitation to File a Search Results Pursuant to Rule 70b(1) EPC dated Mar. 1, 2021, filed Mar. 4, 2021, 16 pages.
CN201810407185.6, Office Action, dated May 2, 2021, 10 pages. (No English Translation).
CN 201710515517.8—Notification to Grant Patent Right for Invention, dated Nov. 1, 2022, 5 pages.
EP18824582.3—Communication pursuant to Article 94(3) EPC dated Feb. 28, 2023, 7 pages.

\* cited by examiner

DATA SHARING SYSTEM AND DATA SHARING METHOD THEREFOR

TECHNICAL FIELD

The disclosure relates to the field of information processing, and particularly to a processing device for performing generative adversarial network and a method for machine creation applying the device.

BACKGROUND

The prior technology performs image (video) creation manually or by image (video) processing software, performs literary creation manually or by text input devices with fixed format, and performs audio creation manually or by voice synthesis software or audio processing software. The image (video) processing software creates an image (video) work through some fixed image and color modes, and the text input device generates a text work through the overall cutting, copying or replacing of the text paragraph, the voice synthesis software and audio processing software creates an audio work by mixing and cutting digital audio signals.

The problems of the prior technology are that manual creation or modification is time-consuming and laborious, and some repeated creative steps cannot save human resources very well; while when various images (video), text and audio are created by software, the software has no learning ability and can only be applied to various application scenarios according to the fixed mode. Besides, the creation still needs manual intervention and guidance, which will result in poor performance, poor universality, without self-learning mechanisms, and failing to free human resources to a greater extent and the like.

SUMMARY

The disclosure provides a processing device for performing generative adversarial network and a method for machine creation applying the processing device, so as to solve the above technical problems.

According to an aspect of the disclosure, a processing device for performing a generative adversarial network (GAN) is provided. The processing device may include a memory configured to receive input data that includes a random noise and reference data, and store discriminator neural network parameters and generator neural network parameters; and a computation device configured to transmit the random noise input data into a generator neural network and perform operation to obtain a noise generation result, and input the noise generation result and the reference data into a discriminator neural network to obtain a discrimination result, and update the discriminator neural network parameters and the generator neural network parameters according to the discrimination result.

In some embodiments, the memory may be further configured to store a computation instruction, and the processing device further may further include a controller configured to decode the computation instruction into one or more operation instructions and send the one or more operation instructions to the computation device.

In some embodiments, the memory may further include a discriminator parameter storage unit configured to store the discriminator neural network parameters; a generator parameter storage unit configured to store the generator neural network parameters; a discriminator instruction storage unit configured to store one or more computation instructions for operations of the discriminator neural network; a generator instruction storage unit configured to store the one or more computation instructions for operations of generator neural network; and a data storage unit configured to store the noise generation result, random noise, and reference data.

In some embodiments, the controller may include an instruction cache unit configured to store the one or more computation instructions associated with a network model; an instruction processing unit configured to decode each of the one or more computation instructions to obtain multiple operation instructions; a storage queue unit configured to store an instruction queue including multiple operation instructions or computation instructions to be performed sequentially; and a dependency relationship processing unit configured to determine, when a plurality of operation instructions exist, whether a first operation instruction forms an associated relationship with a zeroth operation instruction or not before the first operation instruction; if the first operation instruction forms the associated relationship with the zeroth operation instruction, a dependency relationship processing unit caches the first operation instruction in the instruction cache unit, and after the zeroth operation instruction is performed, the dependency relationship processing unit extracts the first operation instruction from the instruction cache unit and transmits the first operation instruction to the computation device.

In some embodiments, the dependency relationship processing unit may be further configured to extract a first storage address interval of required data in the first operation instruction according to the first operation instruction, extract a zeroth storage address interval of a required matrix in the zeroth operation instruction according to the zeroth operation instruction; if an overlapped region exists between the first storage address interval and the zeroth storage address interval, determine that the first operation instruction forms the associated relationship with the zeroth operation instruction; if no overlapped region exists between the first storage address interval and the zeroth storage address interval, determine that the first operation instruction does not form the associated relationship with the zeroth operation instruction.

In some embodiments, the reference data may include a group of pictures including one or more key features, a group of audios including one or more key sampling points, and a word group or phrase including one or more word class tags, and wherein the processing device further includes an input/output unit for acquiring external data and outputting an internal computation result to an external device.

In some embodiments, the computation instruction may include one or more operation fields and an operation code, and the computation instruction includes: a CONFIG instruction configured to configure each constant required by computation for a present layer before computation for each layer of the artificial neural network is started; a COMPUTE instruction configured to complete arithmetic logical computation for each layer of the artificial neural network; an IO instruction configured to implement reading-in of input data required by computation from an external address space and storage of the data back into an external space after computation is completed; a No Operation (NOP) instruction responsible for clearing microinstructions in all microinstruction cache queues presently loaded inside and ensuring all instructions before the NOP instruction are completed, where the NOP instruction does not include any operation; a JUMP instruction responsible for enabling the controller to jump an address of a next instruction to be read in the instruction cache unit to implement jump of a control flow; a MOVE instruction responsible for moving data of a certain address in an internal address space of the device to another address in the internal address space of the device, where this process is independent from a computation unit, and no resource of the computation unit is occupied in an execution process.

In some embodiments, the COMPUTE instruction may include an operation code and five operation fields, and the five operation fields correspond to a starting address of input data, a length of the input data, a starting address of weight, a length of the weight, an address of activation function interpolation table respectively; the IO instruction includes an operation code and three operation fields, and the three operation fields correspond to an address of external data memory, a data length, and an address of internal data memory respectively; the JUMP instruction includes an operation code and an operation field, and the operation field corresponds to a destination address; the MOVE instruction includes an operation code and three operation fields, and the three operation fields correspond to an input address, a data size, and an output address respectively.

In some embodiments, the processing device may further include a DMA (Direct Memory Access) configured to forward the generator neural network parameters from the memory to the computation device, and forward the random noise and the reference data from the data storage unit to the computation device.

The disclosure may further include a method for machine creation, comprising inputting a random noise and reference data into a memory; transmitting, by a computation device, an input data of the random noise into a generator neural network to perform operation to obtain a noise generation result; inputting, by the computation device, the noise generation result and the reference data into a discriminator neural network to obtain a discrimination result; updating, by the computation device, discriminator neural network parameters and generator neural network parameters according to the discrimination result.

In some embodiments, the method may include computing loss values of a generator neural network and a discriminator neural network respectively according to the discrimination result; adaptively updating a parameter in the discriminator neural network according to maximum gradient directions of reduction of the loss values to further improve discrimination accuracy of a discriminator; adaptively updating a parameter in the generator neural network according to maximum gradient directions, discriminated by the discriminator, of increase of the loss values.

In some embodiments, the method may include determining that the discrimination accuracy of the discriminator neural network changes within a set range, and outputting the noise generation result obtained by the generator neural network a final creation result based on the determination that the discrimination accuracy of the discriminator neural network changes within the set range.

In some embodiments, the method may include extracting, by a controller, a computation instruction, parsing the computation instruction into an operation instruction, and sending the operation instruction to the computation device.

In some embodiments, the method may include forwarding, by a DMA, the generator neural network parameter from the memory to the computation device, and forwarding the random noise and the reference data from the data storage unit to the computation device.

In some embodiments, the method may include storing, by a discriminator parameter storage unit, the discriminator neural network parameter; storing, by a generator parameter storage unit, the generator neural network parameter; storing, by a discriminator instruction storage unit, a computation instruction for an operation of discriminator neural network; storing, by a generator instruction storage unit, a computation instruction for an operation of generator neural network; and storing, by a data storage unit, the noise generation result, random noise, and reference data.

In some embodiments, the method may include storing, by an instruction cache unit, the computation instruction associated with a network model; parsing, by an instruction processing unit, the computation instruction to obtain multiple operation instructions; storing, by a storage queue unit, an instruction queue including multiple operation instructions or computation instructions to be performed according to a sequence of the queue; and determining, by a dependency relationship processing unit, if there are multiple operation instructions, whether a first operation instruction forms an associated relationship with a zeroth operation instruction or not before the first operation instruction; if the first operation instruction forms the associated relationship with the zeroth operation instruction, a dependency relationship processing unit caches the first operation instruction in the instruction cache unit, after the zeroth operation instruction is performed, the dependency relationship processing unit extracts the first operation instruction from the instruction cache unit and transmits the first operation instruction to the computation device.

In some embodiments, the method may include extracting a first storage address interval of required data in the first operation instruction according to the first operation instruction, extracting a zeroth storage address interval of the required matrix in the zeroth operation instruction according to the zeroth operation instruction; if an overlapped region exists between the first storage address interval and the zeroth storage address interval, determining that the first operation instruction forms the associated relationship with the zeroth operation instruction, if no overlapped region exists between the first storage address interval and the zeroth storage address interval, determining that the first operation instruction does not form the associated relationship with the zeroth operation instruction.

In some embodiments, the reference data may include a group of pictures including one or more key features, a group of audios including one or more key sampling points and a word group or phrase including one or more word class tags.

In some embodiments, the computation instruction may include one or more operation fields and an operation code, and the computation instruction includes a CONFIG instruction configured to configure each constant required by computation for a present layer before computation for each layer of the artificial neural network is started; a COMPUTE instruction configured to complete arithmetic logical computation for each layer of the artificial neural network; an IO instruction configured to implement reading-in of input data required by computation from an external address space and storage of the data back into an external space after computation is completed; a No Operation (NOP) instruction responsible for clearing microinstructions in all microinstruction cache queues presently loaded inside and ensuring all instructions before the NOP instruction are completed, where the NOP instruction does not include any operation; a JUMP instruction responsible for enabling the controller to jump an address of a next instruction to be read in the instruction cache unit to implement jump of a control flow; a MOVE instruction responsible for moving data of a certain address in an internal address space of the device to another address in the internal address space of the device, where this process is independent from a computation unit, and no resource of the computation unit is occupied in an execution process.

In some embodiments, the COMPUTE instruction may include an operation code and five operation fields, and the five operation fields correspond to a starting address of input data, a length of the input data, a starting address of weight, a length of the weight, an address of activation function interpolation table respectively; the IO instruction includes an operation code and three operation fields, and the three operation fields correspond to an address of external data memory, a data length, and an address of internal data memory respectively; the JUMP instruction includes an operation code and an operation field, and the operation field corresponds to a destination address; the MOVE instruction includes an operation code and three operation fields, and the three operation fields correspond to an input address, a data size, and an output address respectively.

In some embodiments, the memory may be further configured to store a computation instruction, and the processing device may further include a controller configured to extract the computation instruction, parse the computation instruction into an operation instruction and send the operation instruction to the computation device.

The memory may include a discriminator parameter storage unit configured to store the discriminator neural network parameter, a generator parameter storage unit configured to store the generator neural network parameter, a discriminator instruction storage unit configured to store a computation instruction for an operation of discriminator neural network, a generator instruction storage unit configured to store a computation instruction for an operation of generator neural network, and a data storage unit configured to store the noise generation result, random noise, and reference data.

The controller may include: an instruction cache unit configured to store the computation instruction associated with a network model; an instruction processing unit configured to parse the computation instruction to obtain multiple operation instructions; a storage queue unit configured to store an instruction queue including multiple operation instructions or computation instructions to be performed according to a sequence of the queue; and a dependency relationship processing unit configured to determine, if there are multiple operation instructions, whether a first operation instruction forms an associated relationship with a zeroth operation instruction before the first operation instruction or not, if the first operation instruction forms the associated relationship with the zeroth operation instruction, a dependency relationship processing unit caches the first operation instruction in the instruction cache unit, after the zeroth operation instruction is performed, the dependency relationship processing unit extracts the first operation instruction from the instruction cache unit and transmits the first operation instruction to the computation device.

In some embodiments, whether the first operation instruction forming the associated relationship with the zeroth operation instruction before the first operation instruction or not may be determined as follows:

extracting a first storage address interval of required data (for example, a matrix) in the first operation instruction according to the first operation instruction, extracting a zeroth storage address interval of the required matrix in the zeroth operation instruction according to the zeroth operation instruction; if an overlapped region exists between the first storage address interval and the zeroth storage address interval, determining that the first operation instruction forms the associated relationship with the zeroth operation instruction, if no overlapped region exists between the first storage address interval and the zeroth storage address interval, determining that the first operation instruction does not form the associated relationship with the zeroth operation instruction.

In some embodiments, the reference data may include, but is not limited to, a group of pictures including one or more key features, a group of audios including one or more key sampling points and a word group or phrase including one or more word class tags.

In some embodiments, the computation instruction may include one or more operation fields and an operation code, and the computation instruction may include: a CONFIG instruction configured to configure each constant required by computation for a present layer before computation for each layer of the artificial neural network is started; a COMPUTE instruction configured to complete arithmetic logical computation for each layer of the artificial neural network; an IO instruction configured to implement reading-in of input data required by computation from an external address space and storage of the data back into an external space after computation is completed; a No Operation (NOP) instruction responsible for clearing microinstructions in all microinstruction cache queues presently loaded inside and ensuring all instructions before the NOP instruction are completed, where the NOP instruction does not include any operation; a JUMP instruction responsible for enabling the controller to jump an address of a next instruction to be read in the instruction cache unit to implement jump of a control flow; a MOVE instruction responsible for moving data of a certain address in an internal address space of the device to another address in the internal address space of the device, where this process is independent from a computation unit, and no resource of the computation unit is occupied in an execution process.

The COMPUTE instruction may include an operation code and five operation fields, and the five operation fields may respectively correspond to a starting address of input data, a length of the input data, a starting address of weight, a length of the weight, an address of activation function interpolation table.

The IO instruction may include an operation code and three operation fields, and the three operation fields may respectively correspond to an address of external data memory, a data length and an address of internal data memory.

The JUMP instruction may include an operation code and an operation field, and the operation field may correspond to a destination address.

The MOVE instruction may include an operation code and three operation fields, and the three operation fields may respectively correspond to an input address, a data size, and an output address.

In some embodiments, the processing device may further include a DMA (Direct Memory Access) configured to forward the generator neural network parameter from the memory to the computation device, and forward the random noise and the reference data from the data storage unit to the computation device.

In some embodiments, a method for machine creation by use of the processing device may include: inputting a random noise and reference data into a memory, a computation device transmitting an input data of the random noise into a generator neural network to perform operation to obtain a noise generation result, the computation device inputting both of the noise generation result and the reference data into a discriminator neural network to obtain a discrimination result, the computation device updating a discriminator neural network parameter and a generator neural network parameter according to the discrimination result.

The computation device updating a discriminator neural network parameter and a generator neural network parameter according to the discrimination result may include: computing loss values of a generator neural network and a discriminator neural network according to the discrimination result respectively; adaptively updating a parameter in the discriminator neural network according to maximum gradient directions of reduction of the loss values to further improve discrimination accuracy of a discriminator; adaptively updating a parameter in the generator neural network according to maximum gradient directions, discriminated by the discriminator, of increase of the loss values.

In some embodiments, the above steps are repeated, in other words, training is performed, until when the discrimination accuracy of the discriminator neural network changes within a set range, the noise generation result obtained by the generator neural network is output as a final creation result.

In some embodiments, the method for machine creation by use of the processing device may further include: a controller extracting a computation instruction, parsing the computation instruction into an operation instruction and sending the operation instruction to the computation device; and/or a DMA forwarding the generator neural network parameter from the memory to the computation device, and forwarding the random noise and the reference data from the data storage unit to the computation device.

In some embodiments, the method for machine creation by use of the processing device may further include: a discriminator parameter storage unit storing the discriminator neural network parameter; a generator parameter storage unit storing the generator neural network parameter; a discriminator instruction storage unit storing a computation instruction for an operation of discriminator neural network; a generator instruction storage unit storing a computation instruction for an operation of generator neural network; and a data storage unit storing the noise generation result, random noise, and reference data.

In some embodiments, the controller extracting a computation instruction, parsing the computation instruction into an operation instruction and sending the operation instruction to the computation device may include: an instruction cache unit storing the computation instruction associated with a network model; an instruction processing unit parsing the computation instruction to obtain multiple operation instructions; a storage queue unit storing an instruction queue including multiple operation instructions or computation instructions to be performed according to a sequence of the queue; and a dependency relationship processing unit determining, if there are multiple operation instructions, whether a first operation instruction forms an associated relationship with a zeroth operation instruction before the first operation instruction or not; if the first operation instruction forms the associated relationship with the zeroth operation instruction, a dependency relationship processing unit caches the first operation instruction in the instruction cache unit, after the zeroth operation instruction is performed, the dependency relationship processing unit extracts the first operation instruction from the instruction cache unit and transmits the first operation instruction to the computation device.

In some embodiments, whether the first operation instruction forming the associated relationship with the zeroth operation instruction before the first operation instruction or not may be determined as follows:

extracting a first storage address interval of required data (for example, a matrix) in the first operation instruction according to the first operation instruction, extracting a zeroth storage address interval of the required matrix in the zeroth operation instruction according to the zeroth operation instruction; if an overlapped region exists between the first storage address interval and the zeroth storage address interval, determining that the first operation instruction forms the associated relationship with the zeroth operation instruction, if no overlapped region exists between the first storage address interval and the zeroth storage address interval, determining that the first operation instruction does not form the associated relationship with the zeroth operation instruction.

In some embodiments, the reference data may include, but is not limited to, a group of pictures including one or more key features, a group of audios including one or more key sampling points and a word group or phrase including one or more word class tags.

In some embodiments, the computation instruction may include one or more operation fields and an operation code, and the computation instruction may include: a CONFIG instruction configured to configure each constant required by computation for a present layer before computation for each layer of the artificial neural network is started; a COMPUTE instruction configured to complete arithmetic logical computation for each layer of the artificial neural network; an IO instruction configured to implement reading-in of input data required by computation from an external address space and storage of the data back into an external space after computation is completed; a No Operation (NOP) instruction responsible for clearing microinstructions in all microinstruction cache queues presently loaded inside and ensuring all instructions before the NOP instruction are completed, where the NOP instruction does not include any operation; a JUMP instruction responsible for enabling the controller to jump an address of a next instruction to be read in the instruction cache unit to implement jump of a control flow; a MOVE instruction responsible for moving data of a certain address in an internal address space of the device to another address in the internal address space of the device, where this process is independent from a computation unit, and no resource of the computation unit is occupied in an execution process.

The COMPUTE instruction may include an operation code and five operation fields, and the five operation fields may respectively correspond to a starting address of input data, a length of the input data, a starting address of weight, a length of the weight, an address of activation function interpolation table.

The IO instruction may include an operation code and three operation fields, and the three operation fields may respectively correspond to an address of external data memory, a data length and an address of internal data memory.

The JUMP instruction may include an operation code and an operation field, and the operation field may correspond to a destination address.

The MOVE instruction may include an operation code and three operation fields, and the three operation fields may respectively correspond to an input address, a data size, and an output address.

According to another aspect of the disclosure, electronic equipment is provided, which may include the processing device.

The disclosure at least has the following advantages:
1. The present disclosure proposes a method for efficient machine creation of video images, voice audio, and text types using GAN (generative adversarial network), which greatly reduces the complexity of manual processing or creation in related fields. Besides, compared with the previous software implementation, the method based on machine learning provided by the present disclosure, can reflect the artistic sense of abstract creation, and better meet people's expectations of machine creation results.
2. The present disclosure combines the above method with the processing device of the present disclosure, and plans a more reasonable hardware structure and instruction type for the specific implementation method of the GAN, so that the overall implementation becomes fast and efficient, and the time complexity and power consumption are simultaneously reduced.

DETAILED DESCRIPTION OF THE EMBODIMENTS

The "memory" in the disclosure may be integrated in a processing device for performing a GAN, may also be an independent device, and as an external memory, may perform data transmission with the processing device for performing the GAN.

Figure 1:
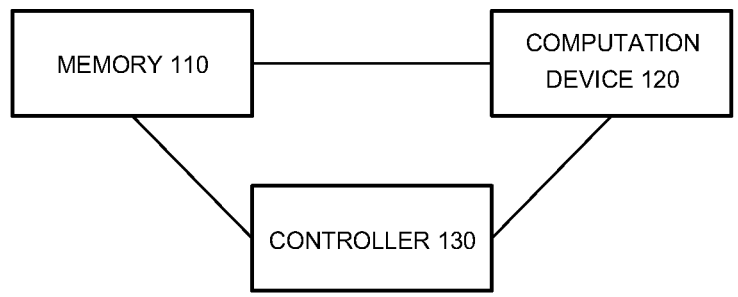
FIG. 1 is a basic block diagram of a processing device for performing a GAN according to an embodiment of the disclosure.

According to the basic concept of the disclosure, a processing device for performing a GAN is provided, which, as illustrated in FIG. 1, may include the follows.

A memory 110 may be configured to receive input data, the input data including a random noise and reference data, and store a discriminator neural network parameter and a generator neural network parameter.

A computation device 120 may be configured to transmit the random noise input data into a generator neural network and may perform computation to obtain a noise generation result, and is also configured to input both of the noise generation result and the reference data into a discriminator neural network and may perform computation to obtain a discrimination result, and may be further configured to update the discriminator neural network parameter and the generator neural network parameter according to the discrimination result.

According to the processing device of the embodiment of the disclosure, a reasonable hardware structure integrating the computation device and the memory is planned for a specific implementation mode of the adversarial network, so that computation efficiency is improved. The memory 110 of the processing device for performing the GAN may receive the input data, the input data including the random noise and the reference data (including, but not limited to, a real picture, voice or text). The reference data may include, but is not limited to, a group of pictures including one or more key features, a group of audios including one or more key sampling points and a word group or phrase including one or more word class tags. The computation device 120 may perform training according to the input data to obtain a group of generation function parameters and obtains the noise generation result (for example, a created image) according to the generation function parameters and the reference data (for example, a reference image), where the input data may be original input data and may also be a result obtained by preprocessing the original data.

In some embodiments, the memory may be further configured to store a computation instruction, the processing device may further include a controller 130, and the controller 130 may be configured to extract the computation instruction, parse the computation instruction into an operation instruction and send the operation instruction to the computation device. Specifically, the controller 130 may be configured to extract the computation instruction from the memory, parse the computation instruction to obtain multiple operation instructions and send the multiple operation instructions and the input data to the computation device.

Figure 2:
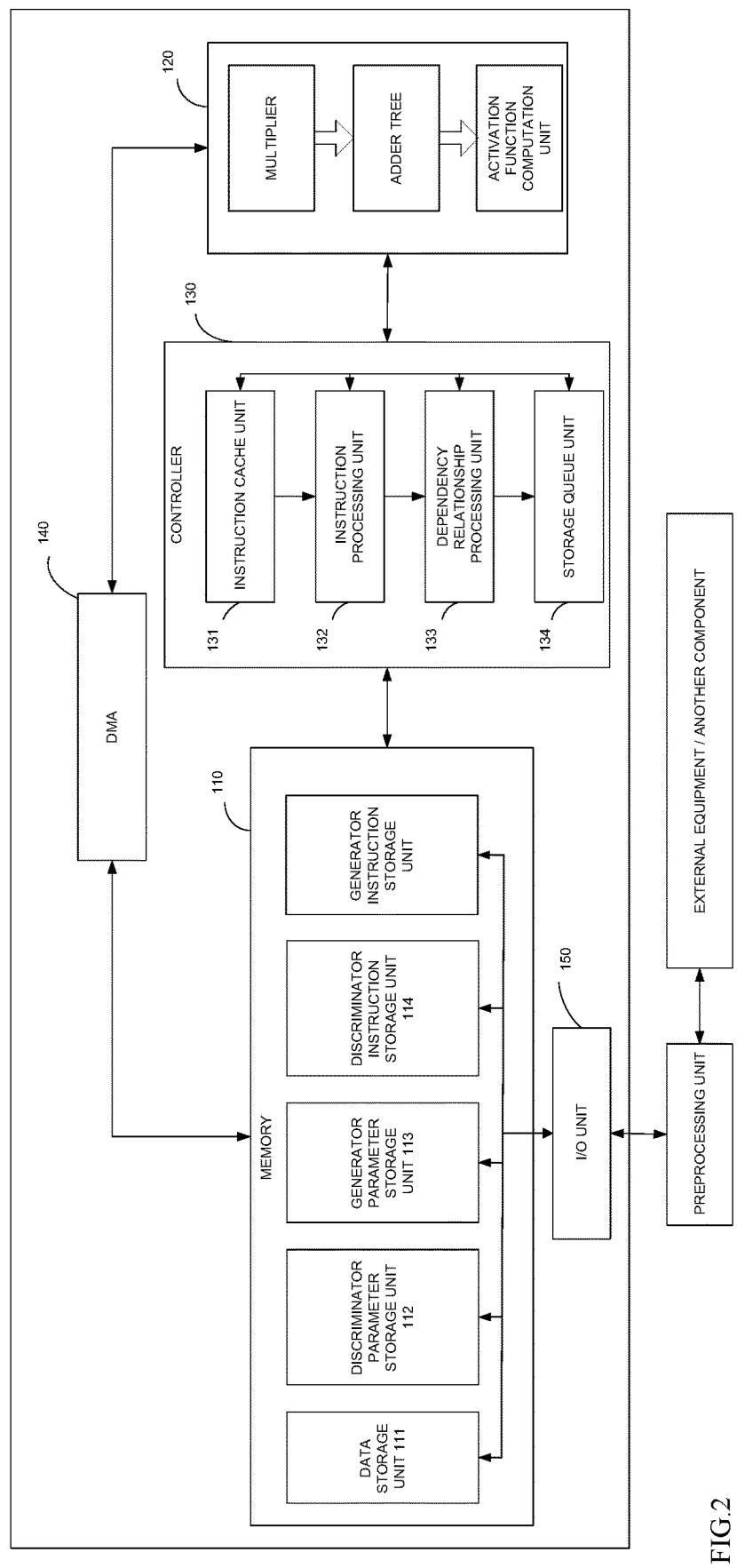
FIG. 2 is a basic block diagram of a processing device for performing a GAN according to another embodiment of the disclosure.

As illustrated in FIG. 2, the memory 110 may include a discriminator parameter storage unit 112 configured to store the discriminator neural network parameter, a generator parameter storage unit 113 configured to store the generator neural network parameter, a discriminator instruction storage unit 114 configured to store a computation instruction for the operation of discriminator neural network, a generator instruction storage unit 115 configured to store a computation instruction for the operation of generator neural network, and a data storage unit 111 configured to store a reference data, where the data may include the ransom noise, the noise generation result (in other words a negative sample, for example, a picture generated by the random noise) and the reference data (the real picture, voice, text or the like obtained from the outside). Here, such a structure is mainly adopted to be adapted to structural characteristics of a generator and discriminator in the GAN, thereby physically distinguishing weight storage of the generator and the discriminator and utilizing storage resources more efficiently. Meanwhile, for adaptation to such a storage structure, Input/Output (I/O) instructions may be modified to distinguish a discriminator I/O instruction from a generator I/O instruction.

The data storage unit 111 may be configured to acquire and store the data, and may further acquire and store a network model (including the discriminator neural network and the generator neural network) and the computation instruction.

Optionally, the processing device may further include an I/O unit 150, which may be configured to acquire external data and output an internal computation result to external equipment or another component.

Optionally, the processing device may further include a DMA 140, which may be configured to forward the generator neural network parameter from the memory to the computation device 120, and forward the random noise and the reference data from the data storage unit 111 to the computation device 120 through the DMA.

Optionally, the memory may further include a storage medium. The storage medium may be an off-chip memory, may also be an on-chip memory during a practical application. The storage medium may be configured to store a data block. The data block may specifically be n-dimensional data, in which n may be an integer greater than or equal to 1. For example, the data block is one-dimensional data, in other words a vector, if n=1; the data block is two-dimensional data, in other words a matrix, if n=2; the data block is a multidimensional tensor if n=3 or is greater than 3.

In some embodiments, the controller 130 may include: an instruction cache unit 131, an instruction processing unit 132, a dependency relationship processing unit 133, and a storage queue unit 134. The instruction cache unit 131 may be configured to store the computation instruction associated with the network model. The instruction processing unit 132 may be configured to parse the computation instruction to obtain multiple operation instructions. The storage queue unit 134 may be configured to store an instruction queue, the instruction queue including multiple operation instructions or computation instructions to be performed according to a sequence of the queue.

As illustrated in Table 1, the computation instruction may include one or more operation fields and an operation code. The computation instruction may include a neural network operation instruction. For example, for the neural network operation instruction, as illustrated in Table 1, register number 0, register number 1, register number 2, register number 3 and register number 4 may be operation fields, and each of register number 0, register number 1, register number 2, register number 3 and register number 4 may be numbers of one or more registers.

A CONFIG instruction configures each constant required by computation for a present layer before computation for each layer of the artificial neural network is started. A COMPUTE instruction completes arithmetic logical computation for each layer of the artificial neural network. An IO instruction implements reading-in of input data required by computation from an external address space and storage of the data back into an external space after computation is completed. A No Operation (NOP) instruction is responsible for clearing microinstructions in all microinstruction cache queues presently loaded inside and ensuring all instructions before the NOP instruction are completed. The NOP instruction does not include any operation. A JUMP instruction is responsible for enabling the controller to jump an address of a next instruction to be read in the instruction cache unit to implement jump of a control flow. A MOVE instruction is responsible for moving data of a certain address in an internal address space of the device to another address in the internal address space of the device, this process is independent from a computation unit, and no resource of the computation unit is occupied in an execution process.

A dependency relationship processing unit may be configured, if there are multiple operation instructions, to determine whether a first operation instruction forms an associated relationship with a zeroth operation instruction before the first operation instruction or not. If the first operation instruction forms the associated relationship with the zeroth operation instruction, the dependency relationship processing unit caches the first operation instruction in the instruction cache unit, After the zeroth operation instruction is performed, the dependency relationship processing unit extracts the first operation instruction from the instruction cache unit and transmits the first operation instruction to the computation device.

Whether the first operation instruction forming the associated relationship with the zeroth operation instruction before the first operation instruction or not is determined as follows.

A first storage address interval of required data (for example, a matrix) in the first operation instruction is extracted according to the first operation instruction, and a zeroth storage address interval of the required matrix in the zeroth operation instruction is extracted according to the zeroth operation instruction. If an overlapped region exists between the first storage address interval and the zeroth storage address interval, it is determined that the first operation instruction forms the associated relationship with the zeroth operation instruction; and if no overlapped region exists between the first storage address interval and the zeroth storage address interval, it is determined that the first operation instruction does not form the associated relationship with the zeroth operation instruction.

Figure 3:
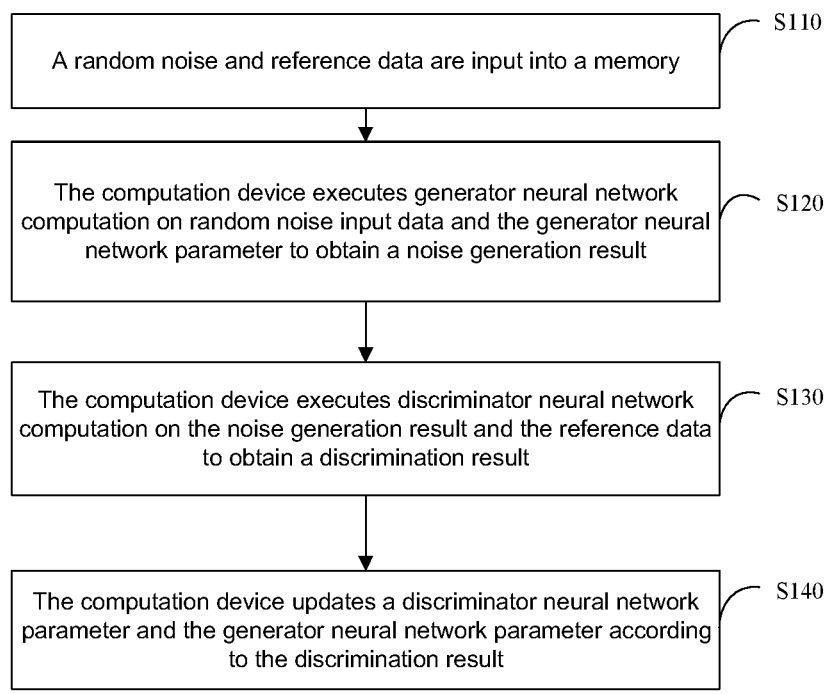
FIG. 3 is a flowchart of a method for machine creation according to an embodiment of the disclosure.

According to another aspect of the embodiments of the disclosure, a method for machine creation by use of the abovementioned processing device is further provided, which, as illustrated in FIG. 3, may include the following steps.

In S110, a random noise and reference data are input into a memory (for example, the random noise and the reference data are stored into a storage unit).

Then, a generator neural network parameter may be forwarded to a computation device 120 through a DMA, and the random noise and the reference data are forwarded from 111 to the computation device 120 through the DMA.

In S120, the computation device may perform generator neural network computation on random noise input data and the generator neural network parameter to obtain a noise generation result.

In S130, the computation device may perform discriminator neural network computation on the noise generation result and the reference data to obtain a discrimination result.

TABLE 1

| Operation code | Register number 0 | Register number 1 | Register number 2 | Register number 3 | Register number 4 |
|---|---|---|---|---|---|
| COMPUTE | Starting address of input data | Length of the input data | Starting address of weight | Length of the weight | Address of activation function interpolation table |
| IO | Address of external data memory | Data length | Address of internal data memory | | |
| NOP | | | | | |
| JUMP | Destination address | | | | |
| MOVE | Input address | Data size | Output address | | |

In S140, the computation device updates a discriminator neural network parameter and the generator neural network parameter according to the discrimination result.

In some embodiments, S140 specifically may include the follows. Loss values of a generator neural network and a discriminator neural network are computed according to the discrimination result respectively. Then a parameter in the discriminator neural network is adaptively updated according to maximum gradient directions of reduction of the loss values to further improve discrimination accuracy of a discriminator. A parameter in the generator neural network is adaptively updated according to maximum gradient directions, discriminated by the discriminator, of increase of the loss values.

S110-S140 are repeated, in other words, training may be performed, until when the discrimination accuracy of the discriminator neural network changes within a set range, the noise generation result obtained by the generator neural network is output as a final creation result.

The processing device and method for creation by use of the device in the disclosure will be specifically described below in combination with specific embodiments. However, those skilled in the art should know that the following specific details are only adopted to understand the disclosure and should not be understood as limits to the disclosure.

Embodiment 1

A processing device for performing a GAN in the embodiment may be configured to create a video and/or an image.

A memory of the processing device for performing the GAN may receive input data, the input data including, but not limited to, a group of pictures including one or more key features. A computation device may perform training according to the input data to obtain a group of generation function parameters and generates and outputs a created image according to the generation function parameters and an input reference image, where the input data may be original input data and may also be a result obtained by preprocessing the original data.

The processing device for performing the GAN may perform adaptive training. For example, the device inputs a group of training pictures including one or more key features, such as a hand-drawn picture, a real scene photo and a key frame picture of a video. The device inputs the input training pictures into a discriminator for discrimination as real pictures together with false pictures generated by a generation model according to noises in a mixed manner, computes loss values of a generator and the discriminator by weighting according to a discrimination result weight respectively, and then adaptively updates a parameter (for example, weights and an offset) in the discriminator according to maximum gradient directions of reduction of the loss values to further improve discrimination accuracy of the discriminator. Meanwhile, the generator adaptively updates a parameter (for example, weights and an offset) in the generator according to maximum gradient directions of increase of the loss values discriminated by the discriminator to further improve a generation capability of the generator, so as to make images generated according to the noises closer to real images and reduce the discrimination accuracy of the discriminator. Finally, if the discrimination accuracy of the discriminator changes within a set range, an optimal generator standard is achieved, and a picture may be generated and created from a random noise by use of the parameter of the generator according to the reference real pictures.

A value of reliability of the input picture of the discriminator is alternative, for example, {0, 1}, where 0 represents that the input picture is an input training picture, and 1 represents the input picture is a false picture generated by the generator according to a noise; and of course, 1 may also represent real and 0 may also represent false. Preferably, the abovementioned adaptive training process is implemented off line.

Specific video or image creation steps may include the following steps.

In step 1, the random noise input data is transmitted into the memory after passing through a preprocessing unit or is directly transmitted into the memory.

In step 2, a DMA transmits the random noise input data in batches to an instruction cache, an input neuron cache and a weight cache.

In step 3, a controller reads an instruction from the instruction cache and decodes and transmits the instruction decoded into the computation device.

In step 4, the computation device may perform corresponding computation according to the instruction. In each layer of a neural network, computation is implemented mainly in three steps. In step 4.1, corresponding input neurons and weights are multiplied in a multiplier. In step 4.2, adder tree computation may be performed in an adder tree, in other words, a result obtained in step 4.1 is added through the adder tree step by step to obtain a weighted sum, and the weighted sum is offset or not processed according to a requirement. In step 4.3, activation function computation may be performed on a result obtained in step 4.2 in an activation function computation unit to obtain output neurons, and the output neurons are transmitted into an output neuron cache.

In step 5, step 2 to step 4 are repeated until computation for all the data is completed, where the noise generation result of the generator may be obtained according to a final output layer of the neural network, and the result is stored in a generator output cache by the DMA.

In step 6, part of the input data and the generation result of the generator are mixed as input data of a discriminator model, and step 2 to step 4 are repeated until computation for all the data is completed, where a discrimination result of the discriminator may be obtained according to a result of the final output layer of the neural network, and the result is stored in a discriminator output cache by the DMA.

In step 7, the DMA transmits the output result of the discriminator into the computation device, partial derivative computation may be performed to obtain an optimal gradient of the generator and an optimal gradient of the discriminator respectively for respective addition with neuron weights of the generator and the discriminator, and corresponding results are stored in the corresponding neuron caches.

In step 8, steps 5, 6 and 7 are repeated until loss functions of the generator and the discriminator are optimal.

In step 9, input reference data is transmitted into the memory after passing through the data preprocessing unit or is directly transmitted into the memory.

In step 10, step 2 to step 4 are repeated, and an output result of an output layer of the neural network in a generator model is a creation result.

According to the requirement of the function, a size of an output created picture (in other words the count of neurons of the final output layer of the artificial neural network), training data (input training features) and a network parameter updating manner (random gradient descent, an Adam algorithm and the like) are required to be preset in an adaptive training stage.

Embodiment 2

A processing device for performing a GAN in the embodiment may be configured to create an audio.

According to the processing device for performing the GAN, a memory of the processing device for performing the GAN may receive input data, the input data including, but not limited to, a group of audios including one or more key sampling points. A computation device may perform training according to the input data to obtain a group of generation function parameters, and generates and outputs a created audio according to the generation function parameters and an input reference image, where the input data may be original input data and may also be a result obtained by preprocessing the original data.

The processing device for performing the GAN may perform adaptive training. For example, the device inputs a group of audio data including one or more key sampling points, such as a voice segment and a synthesized and edited electronic sound effect audio. Then, input training audios are input into a discriminator for discrimination as real audios together with false audios generated by a generation model according to noises in a mixed manner, loss values of a generator and the discriminator are computed by weighting according to a discrimination result respectively, and then a parameter (for example, weights and an offset) is adaptively trained in the discriminator according to maximum gradient directions of reduction of the loss values to further improve discrimination accuracy of the discriminator. Meanwhile, the generator adaptively updates a parameter (for example, weights and an offset) in the generator according to maximum gradient directions of increase of the loss values discriminated by the discriminator to further improve a generation capability of the generator, so as to make a distribution of sampling points of the audios generated according to the noises closer to a distribution of feature sampling points and reduce the discrimination accuracy of the discriminator. Finally, if the discrimination accuracy of the discriminator does not change any more, an optimal generator standard is achieved, and an audio of a reference style may be generated from a random noise by use of the parameter of the generator according to the reference audio.

A value of reliability of the input audio of the discriminator is alternative, for example, $\{0, 1\}$, where 0 represents that the input audio is an input training audio, and 1 represents the input audio is a false audio generated by the generator according to a noise; and of course, 1 may also represent real and 0 may also represent false. Preferably, the abovementioned adaptive training process is implemented off line.

A method by which an artificial neural network obtains a created picture (video key frame) is as follows. Matrix multiplication may be performed on the input reference picture according to an optimal generator weight parameter obtained by training to obtain the final created picture (video key frame).

Specific voice creation steps may include the following steps.

In step 1, random noise (a generation source of a generator model is the random noise and a meaningful audio may be generated by continuous generation according to weights) input data is transmitted into a storage unit after passing through a preprocessing unit or is directly transmitted into the storage unit.

In step 2, a DMA transmits the random noise input data in batches to an instruction cache, an input neuron cache and a weight cache.

In step 3, a controller reads an instruction from the instruction cache and decodes and transmits the instruction decoded into the computation device.

In step 4, the computation device may perform corresponding computation according to the instruction. In each layer of a neural network, computation is implemented mainly in three steps. In step 4.1, corresponding input neurons and weights are multiplied. In step 4.2, adder tree computation may be performed, in other words, a result obtained in step 4.1 is added through an adder tree step by step to obtain a weighted sum, and the weighted sum is offset or not processed according to a requirement. In step 4.3, activation function computation may be performed on a result obtained in step 4.2 to obtain output neurons, and the output neurons are transmitted into an output neuron cache.

In step 5, step 2 to step 4 are repeated until computation for all the data is completed, wherein a noise generation result of the generator may be obtained according to a final output layer of the neural network, and the result is stored in a generator output cache by the DMA.

In step 6, part of the input data and the generation result of the generator are mixed as input data of a discriminator model, and step 2 to step 4 are repeated until computation for all the data is completed, wherein a discrimination result of the discriminator may be obtained according to a result of the final output layer of the neural network, and the result is stored in a discriminator output cache by the DMA.

In step 7, the DMA transmits the output result of the discriminator into the computation device, partial derivative computation may be performed to obtain an optimal gradient of the generator and an optimal gradient of the discriminator respectively for respective addition with neuron weights of the generator and the discriminator, and corresponding results are stored in the corresponding neuron caches.

In step 8, steps 5, 6 and 7 are repeated until loss functions of the generator and the discriminator are optimal.

In step 9, input reference data is transmitted into the storage unit after passing through the data preprocessing unit or is directly transmitted into the storage unit.

In step 10, step 2 to step 4 are repeated, and an output result of an output layer of the neural network in the generator model is a creation result.

According to the requirement of the function, the count of sampling points and audio duration of an output created audio (in other words the count of neurons of the final output layer of the artificial neural network), training data (input training features) and a network parameter updating manner (random gradient descent, an Adam algorithm and the like) are required to be preset in an adaptive training stage.

Embodiment 3

A processing device for performing a GAN in the embodiment is configured for creation of a text type.

A memory of the processing device for performing the GAN may receive input data, the input data including, but not limited to, a word group or phrase (text type) including one or more word class tags. The device may perform training according to the input data to obtain a group of generation function parameters and generates and outputs a text paragraph according to the generation function parameters and an input reference text paragraph, where the input data may be original input data and may also be a result obtained by preprocessing the original data. Data output by the device may be the text paragraph and may also be a special format such as a strict format of poems and the like.

The processing device for performing the GAN may perform adaptive training. For example, the device inputs a word group or phrase including one or more word class tags, such as a voice segment and an audio for synthesis and edition of an electronic sound effect. The device inputs an input training text paragraph into a discriminator for discrimination as a feature text paragraph together with a created text paragraph selected from a word group of the same word class by a generation model according to a noise in a mixed manner, computes loss values of a generator and the discriminator by weighting according to a discrimination result respectively and then adaptively updates a parameter (for example, weights and an offset) in the discriminator according to maximum gradient directions of reduction of the loss values to further improve discrimination accuracy of the discriminator. Meanwhile, the generator adaptively updates a parameter (for example, weights and an offset) in the generator according to maximum gradient directions of increase of the loss values discriminated by the discriminator to further improve a generation capability of the generator, so as to make a distribution of sampling points of the audios generated according to the noises closer to a distribution of feature sampling points and reduce the discrimination accuracy of the discriminator. Finally, if the discrimination accuracy of the discriminator does not change any more, an optimal generator standard is achieved, and a created text of a reference style may be generated from a random noise by use of the parameter of the generator according to the reference text paragraph.

A value of reliability of the input text paragraph of the discriminator is alternative, for example, {0, 1}, where 0 represents that the input word group or phrase is a word group or phrase included in an input training paragraph, and 1 represents the input word group or phrase is a random phrase generated by the generator according to a noise; and of course, 1 may also represent real and 0 may also represent false.

Preferably, the abovementioned adaptive training process is implemented off line. Preferably, the processing device for performing the GAN is an artificial neural network chip.

Specific text type creation steps may include the following steps.

In step 1, the random noise input data is transmitted into the memory after passing through a preprocessing unit or is directly transmitted into the memory.

In step 2, a DMA transmits the random noise input data in batches to an instruction cache, an input neuron cache and a weight cache.

In step 3, a controller reads an instruction from the instruction cache and decodes and transmits the instruction decoded into the computation device.

In step 4, the computation device may perform corresponding computation according to the instruction. In each layer of a neural network, computation is implemented mainly in three steps. In step 4.1, corresponding input neurons and weights are multiplied. In step 4.2, adder tree computation may be performed, in other words, a result obtained in step 4.1 is added through an adder tree step by step to obtain a weighted sum, and the weighted sum is offset or not processed according to a requirement. In step 4.3, activation function computation may be performed on a result obtained in step 4.2 to obtain output neurons, and the output neurons are transmitted into an output neuron cache.

In step 5, step 2 to step 4 are repeated until computation for all the data is completed, where a noise generation result of the generator may be obtained according to a final output layer of the neural network, and the result is stored in a generator output cache by the DMA.

In step 6, part of the input data and the generation result of the generator are mixed as input data of a discriminator model, and step 2 to step 4 are repeated until computation for all the data is completed, wherein a discrimination result of the discriminator may be obtained according to a result of the final output layer of the neural network, and the result is stored in a discriminator output cache by the DMA.

In step 7, the DMA transmits the output result of the discriminator into the computation device, partial derivative computation may be performed to obtain an optimal gradient of the generator and an optimal gradient of the discriminator respectively for respective addition with neuron weights of the generator and the discriminator, and corresponding results are stored in the corresponding neuron caches.

In step 8, steps 5, 6 and 7 are repeated until loss functions of the generator and the discriminator are optimal.

In step 9, input reference data is transmitted into a storage unit after passing through the data preprocessing unit or is directly transmitted into the storage unit.

In step 10, step 2 to step 4 are repeated, and an output result of an output layer of the neural network in a generator model is a creation result.

According to the requirement of the function, the count of sampling points and audio duration of an output created audio (in other words the count of neurons of the final output layer of the artificial neural network), training data (input training features) and a network parameter updating manner (random gradient descent, an Adam algorithm and the like) are required to be preset in an adaptive training stage.

An embodiment of the disclosure further provides electronic equipment, which may include the abovementioned processing device for performing the GAN.

The electronic equipment may include, but is not limited to, a robot, a computer, a printer, a scanner, a tablet computer, an intelligent terminal, a mobile phone, an automobile data recorder, a navigator, a sensor, a webcam, a cloud server, a camera, a video camera, a projector, a watch, an earphone, a mobile storage, wearable equipment, a transportation means, a household electrical appliance and/or medical equipment.

The transportation means may include an airplane, a ship and/or a vehicle; the household electrical appliance may include a television, an air conditioner, a microwave oven, a refrigerator, an electric rice cooker, a humidifier, a washing machine, an electric lamp, a gas cooker and a range hood; and the medical equipment may include a nuclear magnetic resonance spectrometer, a B-ultrasonic scanner and/or an electrocardiograph.

Each functional unit/module/submodule/subunit in the disclosure may be hardware. For example, the hardware may be a circuit, including a digital circuit, an analogue circuit and the like. Physical implementation of a hardware structure may include, but is not limited to, a physical device, and the physical device may include, but not limited to, a transistor, a memristor and the like. The computing module in the computation device may be any proper hardware processor, for example, a CPU, a GPU, an FPGA, a DSP and an ASIC. The storage unit may also be any proper magnetic storage medium or magneto-optical storage medium, for example, an RRAM, a DRAM, an SRAM, an EDRAM, an HBM and an HMC.

Those skilled in the art may clearly know that, for convenient and brief description, descriptions are only made with division of each of the abovementioned functional modules as an example and the abovementioned functions may be allocated to different functional modules for realization according to a requirement during a practical application, in other words, an internal structure of the device is divided into different functional modules to realize all or part of the functions described above.

The purposes, technical solutions and beneficial effects of the disclosure are further described above with the specific embodiments in detail. It should be understood that the above is only the specific embodiment of the disclosure and not intended to limit the disclosure. Any modifications, equivalent replacements, improvements and the like made within the spirit and principle of the disclosure shall fall within the scope of protection of the disclosure.

What is claimed:

1. A processing device for performing a generative adversarial network, comprising:
    a memory configured to:
        store a computation instruction,
        receive input data that includes a random noise and reference data, and
        store discriminator neural network parameters and generator neural network parameters;
    a computation device configured to:
        transmit the random noise input data into a generator neural network and perform operation to obtain a noise generation result, and
        input the noise generation result and the reference data into a discriminator neural network to obtain a discrimination result, and
        update the discriminator neural network parameters and the generator neural network parameters according to the discrimination result; and
    a controller configured to decode the computation instruction into one or more operation instructions and send the one or more operation instructions to the computation device,
    wherein the computation instruction includes one or more operation fields and an operation code, and the computation instruction includes at least one of:
    a CONFIG instruction configured to configure each constant required by computation for a present layer before computation for each layer of the artificial neural network is started;
    a COMPUTE instruction configured to complete arithmetic logical computation for each layer of the artificial neural network;
    an IO instruction configured to implement reading-in of input data required by computation from an external address space and storage of the data back into an external space after computation is completed;
    a No Operation (NOP) instruction responsible for clearing microinstructions in all microinstruction cache queues presently loaded inside and ensuring all instructions before the NOP instruction are completed, where the NOP instruction does not include any operation;
    a JUMP instruction responsible for enabling the controller to jump an address of a next instruction to be read in the instruction cache unit to implement jump of a control flow; and
    a MOVE instruction responsible for moving data of a certain address in an internal address space of the device to another address in the internal address space of the device, where this process is independent from a computation unit, and no resource of the computation unit is occupied in an execution process.

2. The processing device of claim 1, wherein the memory includes:
    a discriminator parameter storage unit configured to store the discriminator neural network parameters;
    a generator parameter storage unit configured to store the generator neural network parameters;
    a discriminator instruction storage unit configured to store one or more computation instructions for operations of the discriminator neural network;
    a generator instruction storage unit configured to store the one or more computation instructions for operations of generator neural network; and
    a data storage unit configured to store the noise generation result, random noise, and reference data.

3. The processing device of claim 1, wherein the controller includes:
    an instruction cache unit configured to store the one or more computation instructions associated with a network model;
    an instruction processing unit configured to decode each of the one or more computation instructions to obtain multiple operation instructions;
    a storage queue unit configured to store an instruction queue including multiple operation instructions or computation instructions to be performed sequentially; and
    a dependency relationship processing unit configured to determine, when a plurality of operation instructions exist, whether a first operation instruction forms an associated relationship with a zeroth operation instruction or not before the first operation instruction; if the first operation instruction forms the associated relationship with the zeroth operation instruction, a dependency relationship processing unit caches the first operation instruction in the instruction cache unit, and after the zeroth operation instruction is performed, the dependency relationship processing unit extracts the first operation instruction from the instruction cache unit and transmits the first operation instruction to the computation device.

4. The processing device of claim 3, wherein the dependency relationship processing unit is further configured to
    extract a first storage address interval of required data in the first operation instruction according to the first operation instruction,
    extract a zeroth storage address interval of a required matrix in the zeroth operation instruction according to the zeroth operation instruction;
    if an overlapped region exists between the first storage address interval and the zeroth storage address interval, determine that the first operation instruction forms the associated relationship with the zeroth operation instruction;
    if no overlapped region exists between the first storage address interval and the zeroth storage address interval, determine that the first operation instruction does not form the associated relationship with the zeroth operation instruction.

5. The processing device of claim 1,
    wherein the reference data includes
        a group of pictures including one or more key features,
        a group of audios including one or more key sampling points, and
        a word group or phrase including one or more word class tags, and
    wherein the processing device further includes an input/output unit for acquiring external data and outputting an internal computation result to an external device.

6. The processing device of claim 1, wherein
the COMPUTE instruction includes an operation code and five operation fields, and the five operation fields correspond to a starting address of input data, a length of the input data, a starting address of weight, a length of the weight, an address of activation function interpolation table respectively;
the IO instruction includes an operation code and three operation fields, and the three operation fields correspond to an address of external data memory, a data length, and an address of internal data memory respectively;
the JUMP instruction includes an operation code and an operation field, and the operation field corresponds to a destination address;
the MOVE instruction includes an operation code and three operation fields, and the three operation fields correspond to an input address, a data size, and an output address respectively.

7. The processing device of claim 1, further comprising a DMA (Direct Memory Access) configured to forward the generator neural network parameters from the memory to the computation device, and forward the random noise and the reference data from the data storage unit to the computation device.

8. A method for machine creation, comprising
inputting a random noise and reference data into a memory;
transmitting, by a computation device, an input data of the random noise into a generator neural network to perform operation to obtain a noise generation result;
inputting, by the computation device, the noise generation result and the reference data into a discriminator neural network to obtain a discrimination result;
updating, by the computation device, discriminator neural network parameters and generator neural network parameters according to the discrimination result,
wherein the updating, by the computation device, the discriminator neural network parameters and the generator neural network parameters according to the discrimination result includes:
computing loss values of a generator neural network and a discriminator neural network respectively according to the discrimination result;
adaptively updating a parameter in the discriminator neural network according to maximum gradient directions of reduction of the loss values to further improve discrimination accuracy of a discriminator;
adaptively updating a parameter in the generator neural network according to maximum gradient directions, discriminated by the discriminator, of increase of the loss values,
wherein the computation instruction includes one or more operation fields and an operation code, and the computation instruction includes at least one of:
a CONFIG instruction configured to configure each constant required by computation for a present layer before computation for each layer of the artificial neural network is started;
a COMPUTE instruction configured to complete arithmetic logical computation for each layer of the artificial neural network;
an IO instruction configured to implement reading-in of input data required by computation from an external address space and storage of the data back into an external space after computation is completed;
a No Operation (NOP) instruction responsible for clearing microinstructions in all microinstruction cache queues presently loaded inside and ensuring all instructions before the NOP instruction are completed, where the NOP instruction does not include any operation;
a JUMP instruction responsible for enabling the controller to jump an address of a next instruction to be read in the instruction cache unit to implement jump of a control flow; and
a MOVE instruction responsible for moving data of a certain address in an internal address space of the device to another address in the internal address space of the device, where this process is independent from a computation unit, and no resource of the computation unit is occupied in an execution process.

9. The method of claim 8, further comprising determining that the discrimination accuracy of the discriminator neural network changes within a set range, and outputting the noise generation result obtained by the generator neural network a final creation result based on the determination that the discrimination accuracy of the discriminator neural network changes within the set range.

10. The method of claim 9, further comprising:
extracting, by a controller, a computation instruction, parsing the computation instruction into an operation instruction, and sending the operation instruction to the computation device.

11. The method of claim 10, further comprising
forwarding, by a DMA, the generator neural network parameter from the memory to the computation device, and forwarding the random noise and the reference data from the data storage unit to the computation device.

12. The method of claim 10, further comprising
storing, by a discriminator parameter storage unit, the discriminator neural network parameter;
storing, by a generator parameter storage unit, the generator neural network parameter;
storing, by a discriminator instruction storage unit, a computation instruction for an operation of discriminator neural network;
storing, by a generator instruction storage unit, a computation instruction for an operation of generator neural network; and
storing, by a data storage unit, the noise generation result, random noise, and reference data.

13. The method of claim 10, wherein extracting, by the controller, a computation instruction, parsing the computation instruction into an operation instruction and sending the operation instruction to the computation device includes:
storing, by an instruction cache unit, the computation instruction associated with a network model;
parsing, by an instruction processing unit, the computation instruction to obtain multiple operation instructions;
storing, by a storage queue unit, an instruction queue including multiple operation instructions or computation instructions to be performed according to a sequence of the queue; and
determining, by a dependency relationship processing unit, if there are multiple operation instructions, whether a first operation instruction forms an associated relationship with a zeroth operation instruction or not before the first operation instruction; if the first operation instruction forms the associated relationship with the zeroth operation instruction, a dependency relationship processing unit caches the first operation instruction in the instruction cache unit, after the zeroth operation instruction is performed, the dependency relationship processing unit extracts the first operation instruction from the instruction cache unit and transmits the first operation instruction to the computation device.

14. The method of claim 13, wherein determining whether the first operation instruction forms the associated relationship with the zeroth operation instruction or not before the first operation instruction includes:

extracting a first storage address interval of required data in the first operation instruction according to the first operation instruction, extracting a zeroth storage address interval of the required matrix in the zeroth operation instruction according to the zeroth operation instruction; if an overlapped region exists between the first storage address interval and the zeroth storage address interval, determining that the first operation instruction forms the associated relationship with the zeroth operation instruction, if no overlapped region exists between the first storage address interval and the zeroth storage address interval, determining that the first operation instruction does not form the associated relationship with the zeroth operation instruction.

15. The method of claim 8, wherein the reference data includes a group of pictures including one or more key features, a group of audios including one or more key sampling points and a word group or phrase including one or more word class tags.

16. The method of claim 8, wherein the COMPUTE instruction includes an operation code and five operation fields, and the five operation fields correspond to a starting address of input data, a length of the input data, a starting address of weight, a length of the weight, an address of activation function interpolation table respectively;

the IO instruction includes an operation code and three operation fields, and the three operation fields correspond to an address of external data memory, a data length, and an address of internal data memory respectively;

the JUMP instruction includes an operation code and an operation field, and the operation field corresponds to a destination address;

the MOVE instruction includes an operation code and three operation fields, and the three operation fields correspond to an input address, a data size, and an output address respectively.

\* \* \* \* \*